United States Patent [19]

Gedridge, Jr. et al.

[11] Patent Number: 6,020,253

[45] Date of Patent: Feb. 1, 2000

[54] USE OF TERTIARYBUTYLBIS-(DIMETHYLAMINO)PHOSPHINE IN FORMING SEMICONDUCTOR MATERIAL BY CHEMICAL VAPOR DEPOSITION

[75] Inventors: Robert W. Gedridge, Jr.; Thomas J. Groshens; Kelvin T. Higa, all of Ridgecrest, Calif.

[73] Assignee: The United States of America as represented by the Secretary of the Navy, Washington, D.C.

[21] Appl. No.: 09/267,911

[22] Filed: Mar. 5, 1999

Related U.S. Application Data

[62] Division of application No. 08/803,208, Feb. 2, 1997.

[51] Int. Cl.$^7$ ..................................... H01L 21/20
[52] U.S. Cl. .......................................... 438/478; 438/483
[58] Field of Search ..................... 438/478, 483, 438/779; 568/8; 423/87; 427/248.1

[56] References Cited

U.S. PATENT DOCUMENTS

| | | | |
|---|---|---|---|
| 4,268,454 | 5/1981 | Pez et al. ............................. | 260/439 R |
| 5,306,816 | 4/1994 | Murata et al. .......................... | 540/200 |

OTHER PUBLICATIONS

Hill, C.W., "Low Pressure Pyrolysis Studies of a New Phosphorus Precursor: Tertiarybutylbis (dimethylamino) phosphine." Journal of Electronic Materials, vol. 25, No. 9, 1996, pp. 1434–1438, 1996.

Hill, C.W., "A comparison of the reactions of phosphorus precursors on deposited GaP and InP films." Journal of Crystal Growth 181, (1997), pp. 321–325, 1997.

Ryu, H.H., "Chemical beam epitaxy of InP without pre-cracking using tertiarybutylbis (dimethylamino) phosphine." Journal of Crystal Growth 172 (1997) pp. 1–4, 1997.

*Primary Examiner*—Savitri Mulpuri
*Attorney, Agent, or Firm*—Gregory M. Bokar; Earl H. Baugher Jr.

[57] ABSTRACT

A new compound, tertiarybutylbis-(dimethylamino) phosphine, $((CH_3)_3C)((CH_3)_2N)_2P$, is used as a precursor in forming phosphorus-containing semiconductor material by chemical vapor deposition. Tertiarybutylbis-(dimethylamino)phosphine is prepared by reacting a phosphorus trihalide, $PX_3$, with the tertiarybutyl Grignard reagent $((CH_3)_3C)MgX$. The resultant product is treated with lithium dimethylamide reagent $LiN(CH_3)_2$. Tertiarybutylbis-(dimethylamino)phosphine is then recovered from the reaction mixture. Phosphorus-containing semiconductor materials are formed by chemical vapor deposition by means of bubbling a carrier gas through the new compound and then transporting the $((CH_3)_3C)((CH_3)_2N)_2P$ with the carrier gas to a heated substrate. Additional elements from groups II, III, V, and VI of the periodic table are then deposited on the substrate to form the Phosphorus-containing semiconductor materials.

1 Claim, No Drawings

USE OF TERTIARYBUTYLBIS-(DIMETHYLAMINO)PHOSPHINE IN FORMING SEMICONDUCTOR MATERIAL BY CHEMICAL VAPOR DEPOSITION

CROSS-REFERENCE TO RELATED APPLICATIONS

This application is being filed as a Divisional application in accordance with 37 C.F.R. 1.53(b). The Parent application of this Divisional is application Ser. No. 08/803,208 filed Feb. 2, 1997.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

MICROFICHE APPENDIX

Not Applicable.

BACKGROUND OF THE INVENTION

1. Field of the Invention

The present invention relates to the process of preparing tertiarybutylbis-(dimethylamino)phosphine, $((CH_3)_3C)((CH_3)_2N)_2P$, and its use in chemical vapor deposition processes to produce phosphorus-containing semiconductor materials.

Currently, there is a need for an alternative organophosphorus precursor semiconductor material without substituents, which results in unintentional carbon incorporation for low temperature Organometallic Vapor Phase Epitaxy (hereinafter, OMVPE) and Chemical Beam Epitaxy (hereinafter, CBE). The availability of alternative OMVPE and CBE organophosphorus precursors with lower pyrolysis temperatures and lower carbon incorporation characteristics would greatly enhance the development of phosphorus containing semiconductor materials and devices. This invention addresses this need of formulating an alternative phosphorus-containing semiconductor material.

2. Description of the Prior Art

A variety of semiconductor systems containing phosphorus have been investigated for applications in electronic and optoelectronic devices (e.g. light-emitting diodes and lasers). Phosphorus containing binary materials, Indium Phosphide (hereinafter, InP) Gallium Phosphide (hereinafter, GaP), as well as ternary and quaternary materials, (e.g. $GaP_{1-x}Sb_x$, $InP_{1-x}Sb_x$, $In_{1-x}Ga_xP$, $Ga_{1-x}Al_xP$, $Al_{1-(x+y)}Ga_xIn_yP$, $In_{1-x}P_xAs_{1-y}Sb_y$, and $Ga_{1-x}In_xAs_{1-y}P_y$), have been grown heteroepitaxially by OMVPE and CBE techniques for the production of high quality semiconductor materials from organometallic precursors such as organophosphorus compounds.

Certain semiconductor materials have been grown by OMVPE and CBE using tertiarybutylphosphine (hereinafter, TBP) as the organophosphorus source compound. For CBE growth of phosphorus-containing semiconductor materials the phosphorus precursor compound is pyrolyzed in a high temperature cracker cell prior to contact with the heated substrate. The cracker cell temperature is critical for InP growth by CBE using TBP. Excessively high cracker cell temperature increases unintentional carbon incorporation. Attempts at low growth temperature in OMVPE or growth without the use of a high temperature cracker cell in CBE results in significant problems due to the incomplete pyrolysis of the organophosphorus compound.

An alternative organophosphorus precursor for OMVPE and CBE is needed which has a lower pyrolysis temperature than TBP. An important requirement for the organophosphorus precursor is that it must pyrolyze with minimal unintentional impurity incorporation. The availability of alternative phosphorus (hereinafter, P) source compounds for OMVPE and CBE would greatly enhance the development of phosphorus-containing semiconductor materials. Development of new P source compounds for chemical vapor deposition processes is of much interest. These compounds would eliminate the need for lowering the cracker cell temperature or film-growth temperature of P-containing semiconductor materials and also would eliminate the need to alter the chemistry to minimize unintentional impurities.

BRIEF SUMMARY OF THE INVENTION

The new compound, Tertiarybutylbis-(dimethylamino)phosphine, $(CH_3)_3C)((CH_3)_2N)_2P$, is used as a precursor in forming phosphorus-containing semiconductor material by chemical vapor deposition.

Tertiarybutylbis-(dimethylamino)phosphine is conveniently prepared in a two step synthesis and isolated by reacting a phosphorus trihalide $(PX_3)$ with one equivalent of tertiarybutyl Grignard reagent $((CH_3)_3C)MgX$, where X is a halide; treating the resulting product $((CH_3)_3C)PX_2$, where X is a halide, recovered from the solvent with two equivalents of lithium dimethylamide $Li(N(CH_3)_2)$; and recovering tertiarybutylbis-(dimethylamino)phosphine from the reaction mixture.

The reaction is carried out in an organic solvent using approximately one equivalent of $((CH_3)_3C)MgX$ in relation to the $PX_3$, at or above about −78 C. The intermediate product, $((CH_3)_3C)PX_2$, is isolated and purified and then treated with approximately two equivalents of $LiN(CH_3)_2$, in relation to the $((CH_3)_3C)PX_2$, at or above about 0 C.

Also, according to the invention, an improved process is provided for forming phosphorus-containing semiconductor materials using chemical vapor deposition. In the process, tertiarybutylbis(dimethylamino)phosphine is used as the source of phosphorus.

The objects of the present invention are to:

1) Provide an improved organophosphorus source compound for phosphorus-containing semiconductor materials.

2) Provide an organo-phosphorus precursor for chemical vapor deposition of phosphorus-containing semiconductor materials having a lower decomposition temperature than organophosphorus precursors used prior to this time.

3) Provide a novel organophosphorus precursor which pyrolyses with minimal unintentional impurity incorporation into the phosphorus-containing semiconductor material.

4) Provide a process for preparing such a phosphorus source compound or precursor for production of phosphorus-containing semiconductor materials.

5) Provide a process of forming a phosphorus-containing semiconductor material by chemical vapor deposition, using an improved organophosphorus source compound.

DETAILED DESCRIPTION OF THE INVENTION

Tertiarybutylbis-(dimethylamino)phosphine is prepared according to the following reaction scheme:

Reaction Scheme I

Reaction #1:

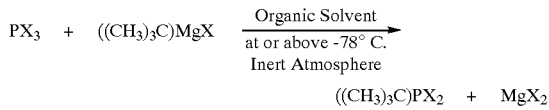

$$PX_3 + ((CH_3)_3C)MgX \xrightarrow[\text{Inert Atmosphere}]{\text{Organic Solvent at or above } -78° C.} ((CH_3)_3C)PX_2 + MgX_2$$

Reaction #2:

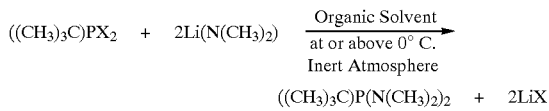

$$((CH_3)_3C)PX_2 + 2Li(N(CH_3)_2) \xrightarrow[\text{Inert Atmosphere}]{\text{Organic Solvent at or above } 0° C.} ((CH_3)_3C)P(N(CH_3)_2)_2 + 2LiX$$

Reaction Scheme #2

Reaction #3:

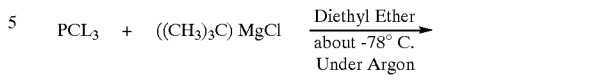

$$PCL_3 + ((CH_3)_3C)MgCl \xrightarrow[\text{Under Argon}]{\text{Diethyl Ether about } -78° C.} ((CH_3)_3C)PCl_2 + MgCl_2$$

Reaction #4:

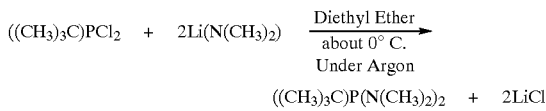

$$((CH_3)_3C)PCl_2 + 2Li(N(CH_3)_2) \xrightarrow[\text{Under Argon}]{\text{Diethyl Ether about } 0° C.} ((CH_3)_3C)P(N(CH_3)_2)_2 + 2LiCl$$

In preferred practice, under an inert atmosphere (e.g. argon, nitrogen or helium), a phosphorus trihalide, $PX_3$, is reacted with about one equivalent of tertiarybutyl Grignard reagent, $((CH_3)_3C)MgX$, at or above about $-78°$ C. in a suitable solvent. The resultant mixture is warmed to room temperature. The intermediate compound tertiarybutylphosphorus dihalide, $((CH_3)_3C)PX_2$, where X is a halide, is isolated from the solvent and then treated with two equivalents of lithium dimethylamide $Li(N(CH_3)_2)$ in a suitable solvent at about $0°$ C. All preparation, isolation, and purification of the air-sensitive product is carried out using inert-atmosphere techniques.

In reaction #2 above, a 2:1 ratio of pure lithium dimethylamide reagent to the tertiarybutylphosphorus dihalide is employed. In addition, it is recommended that a small excess (about 5%) of the lithium dimethylamide be used in the event that the reagent is not pure.

Solvents used during synthesis must be thoroughly free of oxygen or water. While diethyl ether is the preferred solvent to carry out the reactions, other oxygen and water free organic solvents can be employed such as tetrahydrofuran or other etheral solvents, or some combination of these solvents.

The reactions, as illustrated in Reactions #1 and #2 above, are commenced at low temperatures ($-78°$ C.) for the addition of the tertiarybutyl Grignard reagent and at higher temperatures ($0°$ C.) for the addition of the lithium dimethylamide reagent. If the addition of the tertiarybutyl Grignard reagent is added at temperatures above $-50°$ C., more of the unwanted di(tertiarybutyl)phosphoruschloride and tris(tertiarybutyl)phosphine side products form. After the addition of the Grignard reagents is complete, the intermediate product tertiarybutyl-phosphorusdichloride is formed. The intermediate is isolated from unreacted $PX_3$ and other side products by filtration and fractional distillation of the reaction mixture to remove solid $MgX_2$ salts. Isolation and purification of the intermediate compound, tertiarybutyl-phosphorusdichloride, serves to reduce or eliminate the formation of tris(dimethylamino)phosphorus, a compound with a vapor pressure close to that of tertiarybutylbis-(dimethylamino)phosphine and difficult to separate from by fractional distillation.

The purified solid, tertiarybutyl-phosphorusdichloride, is diluted with diethylether and slowly added to a stirred suspension of lithium dimethylamide maintained at about $0°$ C. The mixture is filtered in an inert atmosphere to remove the LiCl solid and the solvent is fractionally removed by distillation. Tertiarybutylbis-(dimethylamino)phosphine is then collected and purified by fractional vacuum distillation. A preferred reaction scheme is noted below:

Pressure is not a critical factor in carrying out reactions #3 and #4 above and generally ambient pressure is employed. However, higher or lower pressures can be utilized in the preparation of tertiarybutylbis(dimethylamino)phosphine.

Tertiarybutylbis(dimethylamino)phosphine is a colorless liquid at room temperature, is air and water-sensitive and requires its preparation, isolation, and purification under a dry inert atmosphere. Tertiarybutylbis-(dimethylamino) phosphine has a melting point of about $-60°$ C. and a vapor pressure of about 1.8 torr (mm Hg) at $25°$ C.

Based on the following information, it is apparent that the present invention provides for the preparation and isolation of the novel compound tertiarybutylbis-(dimethylamino) phosphine, $((CH_3)_3C)((CH_3)_2N)_2P$. This compound provides an alternative improved phosphorus precursor for forming phosphorus-containing semiconductor materials using chemical vapor deposition techniques (e.g. organometallic vapor phase epitaxy). In the process, tertiarybutylbis (dimethylamino)phosphine is used as a source of phosphorus. The process can be used in forming III/V phosphorus-containing semiconductor materials, and can also be used to introduce phosphorus as a dopant in IV and II/VI semiconductor materials. Group II refers to elements from Group IIB also refered to as Group 12 of the periodic table which includes Zn (zinc), Cd (cadmium), and Hg (mercury). Group III refers to Group IIIA or Group 13 elements which includes Al (aluminum), Ga (gallium), In (indium), and Ti (thallium). Group IV refers to Group IVA or Group 14 elements which includes C. (carbon), Si (silicon), Ge (germanium), Sn (tin), and Pb (lead). Group V refers to Group VA or Group 15 elements which includes N (nitrogen), P (phosphors), As (arsenic), Sb (antimony), and Bi (bismuth). Group VI refers to Group VIA or Group 16 elements which includes O (oxygen), S (sulfur), Se (selenium), and Te (tellurium).

The following are examples of preparation and use of the novel organophosphorus compound of the invention:

EXAMPLE 1

Tertiarybutylbis(dimethylamino)phosphine, $((CH_3)_3C)((CH_3)_2N)_2P$ was prepared according to Reaction Scheme #1 in a two step synthesis by reaction of $PCl_3$ with one equivalent of tertiarybutyl Grignard reagent followed by reaction of resulting $((CH_3)_3C)PCl_2$ with two equivalents of lithium dimethylamide $Li(N(CH_3)_2)$ reagent.

850 ml (1.7 mole) of 2.0 M $((CH_3)_3C)MgCl$ in diethyl ether was added dropwise (drop time=3 hours) with vigorous stirring to a solution of 225 g (1.64 mole $PCl_3$) in 3000 ml dry deoxygenated diethylether at $-78°$ C. The white slurry was allowed to warm to room temperature slowly (about 4 hours time) and stirred at room temperature for an additional 8 hours. The slurry was filtered to remove the solid magnesium chloride by-product and the tertiarybutylphosphorusdichloride, $((CH_3)_3C)PCl_2$, was isolated from the solvent by fractional distillation. After removing the diethylether solvent using a 0 C. condenser, the distillation condenser was warmed to 55° C. and the tertiarybutylphosphorusdichloride product, 165 g (1.04 mole, 65% yield) was collected at 60° C. /12 mmHg free from $PCl_3$ and better than 99% purity after distillation by $H^1$NMR (0.90 ppm, d, $^3J_{P-H}$=15 Hz) and $P^{31}$NMR (200.22 ppm, s referenced to phosphoric acid).

A solution of 155 g (0.97 mole) $((CH_3)_3C)PCl_2$ in 500 ml in dry deoxygenated diethyl ether was added (addition time of 30 minutes) to a stirred suspension of 105 g (2.06 mole) $LiNMe_2$ in 3000 ml diethylether at 0° C. The suspension was allowed to warm to room temperature then stirred for an additional 12 hours at room temperature. The slurry was filtered to remove the solid LiCl and the filtrate was fractionally distilled to give 151 g (0.86 mole, 89% yield of $((CH_3)_3C)((CH_3)_2N)_2P$ crude product bp 56° C./6.5 mmHg $H^1$NMR (2.64 ppm, 12H, d, $^3J_{P-H}$=8.7 Hz; 1.13 ppm, 9H, d, $^3J_{P-H}$=13 Hz) and $P^{31}$NMR (120.6 ppm, s referenced to phosphoric acid)]. Tertiarybutyl-bis(dimethylamino) phosphine was purified by repeated fractional distillation as a colorless liquid (mp −60° C.) with almost no odor, which reacts slowly with water and air.

EXAMPLE 2

Tertiarybutylbis(dimethylamino)phosphine was prepared according to Reaction Scheme #2 by reaction of tertiarybutyllithium with bis(dimethylamino)phosphoruschloride which had been prepared from the reaction of neat trisdimethylaminophosphine and phosphorustrichloride. Trisdimethylaminophosphine was prepared from the reaction of phosphorus trichloride with three equivalents of lithium dimethylamide in diethylether at 0° C. A solution of 88.4 g (0.64 mol) $PCl_3$ in 50 ml diethylether was added dropwise to a stirred suspension of 105 g (2.06 mol) $LiNMe_2$ in 1.5 liters diethylether at 0° C. The resulting mixture was filtered and the $P(NMe_2)_3$ product, 0.444 mol, 72.5 g (69% yield based on $PCl_3$), was fractionally distilled from the filtrate at 45° C./9.5 torr. $PCl_3$ 0.222 mol (30.5 g) was added slowly to the purified $P(NMe_2)_3$ with stirring at 0° C. The resulting $P(NMe2)_2Cl$ compound was heated to 35° C. for one hour then diluted with 1 liter of hexane and cooled to −78° C. A 400 ml aliquot (0.68 mol) of tertiarybutyl lithium, $((CH_3)_3C)Li$, in hexane was added dropwise over a two hour period with stirring. The mixture was allowed to warm, filtered and the tertiarybutyl-bis(dimethylamino)phosphine, $((CH_3)_3C)P(NMe_2)_2$, product, 55 g, 0.31 mol (45% yield based on $P(NMe_2)_2Cl$), was purified by repeated fractional distillation of the filtrate.

EXAMPLE 3

Single crystalline layers of indium phosphide (InP) were grown by CBE technique using the new phosphorus precursor, tertiarybutylbis-(dimethylamino)phosphine, with and without thermal pre-cracking. The indium source compound used was ethyldimethylindium (hereinafter, EDMIn). This is the first report of CBE growth of single crystalline InP without thermally pre-cracking the phosphorus source. The temperature required for 50% thermal pyrolysis of tertiarybutylbis-(dimethylamino)phosphine has been determined to be about 425° C. Indium phosphide layers were grown by CBE without pre-cracking the tertiarybutylbis-(dimethylamino)phosphine at substrate temperatures from about 450° C. to 520° C. The morphology was mirror-like at substrate temperatures above 450° C. Strong bound excition (hereinafter, BE) photoluminesence (hereinafter, PL) was observed with only a relatively small donor-acceptor pair (hereinafter, DAP) impurity peak present. The values of PL full width at half maximum (hereinafter, FWHM) for InP grown with uncracked tertiarybutylbis-(dimethylamino) phosphine were typically 10 meV at 16 K. For InP grown with cracked tertiarybutylbis-(dimethylamino)phosphine, values of PL FWHM were as low as 6 meV at 16 K, but there was a significant increase in the DAP impurity peak compared to InP grown with uncracked tertiarybutyl-bis-(dimethylamino)phosphine.

Since various changes and modifications can be made in the invention without departing from the spirit of the invention, the invention is not to be taken as limited except by the scope of the appended claims.

What is claimed is:

1. The process of forming a phosphorus-containing semiconductor material by chemical vapor deposition, comprising the steps of:

utilizing $((CH_3)_3C)((CH_3)_2N)_2P$ as a source of phosphorus;

bubbling a carrier gas through liquid $((CH_3)_3C)((CH_3)_2N)_2P$;

transporting said $(CH_3)_3C)((CH_3)_2N)_2P$ with said carrier gas to a heated substrate;

depositing P from said $((CH_3)_3C)((CH_3)_2N)_2P$;

depositing additional elements on said substrate from groups selected from Groups IIB, IIIA, IVA, VA and VIA of the periodic table; and forming III/V P-containing semiconductor materials or to provide P as a dopant in II/VI or IV semiconductor materials.

\* \* \* \* \*